United States Patent
Ginetti et al.

(10) Patent No.: US 8,750,413 B2
(45) Date of Patent: Jun. 10, 2014

(54) DIGITAL MODULATION WITH ARBITRARY INPUT SAMPLING AND OUTPUT MODULATION FREQUENCIES

(75) Inventors: Bernard Ginetti, Antibes (FR); Zhongxuan Zhang, Fremont, CA (US)

(73) Assignee: MStar Semiconductor, Inc., Hsinchu Hsien (TW)

(*) Notice: Subject to any disclaimer, the term of this patent is extended or adjusted under 35 U.S.C. 154(b) by 118 days.

(21) Appl. No.: 13/484,485

(22) Filed: May 31, 2012

(65) Prior Publication Data

US 2013/0064324 A1 Mar. 14, 2013

Related U.S. Application Data

(60) Provisional application No. 61/532,695, filed on Sep. 9, 2011.

(51) Int. Cl.
*H04K 1/02* (2006.01)
*H04L 25/03* (2006.01)
*H04L 25/49* (2006.01)

(52) U.S. Cl.
USPC ............... 375/296; 375/295; 327/291

(58) Field of Classification Search
USPC .......................................... 375/296
See application file for complete search history.

(56) References Cited

U.S. PATENT DOCUMENTS

| | | | | |
|---|---|---|---|---|
| 5,963,160 A | * | 10/1999 | Wilson et al. | ............... 341/143 |
| 2004/0192229 A1 | | 9/2004 | Morris et al. | |
| 2005/0237121 A1 | * | 10/2005 | Hirano et al. | ................. 331/16 |
| 2006/0291589 A1 | | 12/2006 | Eliezer et al. | |

OTHER PUBLICATIONS

U.S. Appl. No. 13/661,412, filed Oct. 26, 2012, 25 pages.
Ionascu et al., "Design and Implementation of Video DAC in 0.13μm CMOS Technology", 2003 IEEE, pp. 381-384.
Myderrizi et al., "A High-Speed Swing Reduced Driver Suitable for Current-Steering Digital-to-Analog Converters", 2009, IEEE, pp. 635-638.
Choi et al., "Design of Oversampling Current Steering DAC With 640 MHZ Equivalent Clock Frequency", 2002 IEEE, 4 pages.

* cited by examiner

*Primary Examiner* — Erin File
(74) *Attorney, Agent, or Firm* — Edell, Shapiro & Finnan, LLC

(57) ABSTRACT

An arbitrary modulation frequency of a modulating signal is selected. The modulating signal is applied to an information-bearing signal, where such modulation is carried out through digital signal processing operations. The digitally modulated signal is resolution-reduced and the quantization noise introduced by such is shaped to locate a spectral null in the noise transfer function of the resolution reducing modulator at the modulation frequency. Thus, the modulation frequency can be selected independently of the clock frequency at which the resolution-reduced samples are converted to an analog signal.

17 Claims, 9 Drawing Sheets

DIGITAL MODULATION WITH ARBITRARY INPUT SAMPLING AND OUTPUT MODULATION FREQUENCIES

RELATED APPLICATION DATA

This patent application claims benefit of U.S. Provisional Patent Application 61/532,695 entitled, "System Able of Arbitrary Input/Output Frequency Based on NCO and Sigma-Delta with Programmable Noise Transfer Function," filed on Sep. 9, 2011, the entire disclosure of which is incorporated herein by reference.

TECHNICAL FIELD

The present disclosure relates to digital modulation of signals.

BACKGROUND

Continued developments in integrated circuit (IC) design, fabrication and packaging has afforded ever denser and faster circuits. Indeed, developments in complimentary metal-oxide semiconductor (CMOS) technologies have allowed digital circuits to implement functionality that was once only achievable through purely analog circuits. By way of high-performance CMOS processes, such modulation may be performed entirely in the digital domain, including the final tuning.

Converting a digitally modulated signal into a corresponding modulated analog signal typically requires a digital-to-analog converter (DAC) that can perform signal conversions at a very high sampling rate so that spectral replicas are removed from the desired spectral band of the reconstructed signal. Practically, such high sampling rate is easy to achieve on the DAC, which allows a reduction sample resolution for a given signal-to-noise ratio (SNR) due to quantization noise spreading (oversampling). This reduced resolution simplifies the analog design and improves its performance, e.g., for a given area and power, bigger devices with better matching can be used, improving the overall linearity.

The ability of the modulator to support multiple output carrier frequencies from an arbitrary clock source is considered advantageous, often a must have, in that the clock frequency is very likely to be constrained by other factors. Multiple modulation frequencies have, in the past, been achieved by a fractional-N synthesizer and a sample rate converter. A classical solution consists in clocking the DAC at four times the carrier frequency resulting in a very simple digital sequence (1,1, −1, −1) for the oscillator signal by which the carrier modulation is achieved. However, the need has been felt for modulation techniques by which an information-bearing signal may be digitally modulated by a signal that is independent of the clock frequency while avoiding the use of multiple asynchronous clocks.

SUMMARY

A frequency modulator generates a modulated digital signal from an information-bearing digital signal and a modulation signal having an arbitrary modulation frequency. A noise-shaping modulator generates a reduced resolution digital signal from the modulated digital signal. The noise-shaping modulator further generates the reduced resolution digital signal such that quantization noise generated by the resolution reduction is attenuated by a spectral null of a noise transfer function characterizing the noise-shaping modulator. A signal converter generates an analog signal conveying the information on the information-bearing digital signal on an analog carrier signal having the modulation frequency. The modulation frequency is independent of the signal conversion rate.

DESCRIPTION OF EXAMPLE EMBODIMENTS

Figure 1:
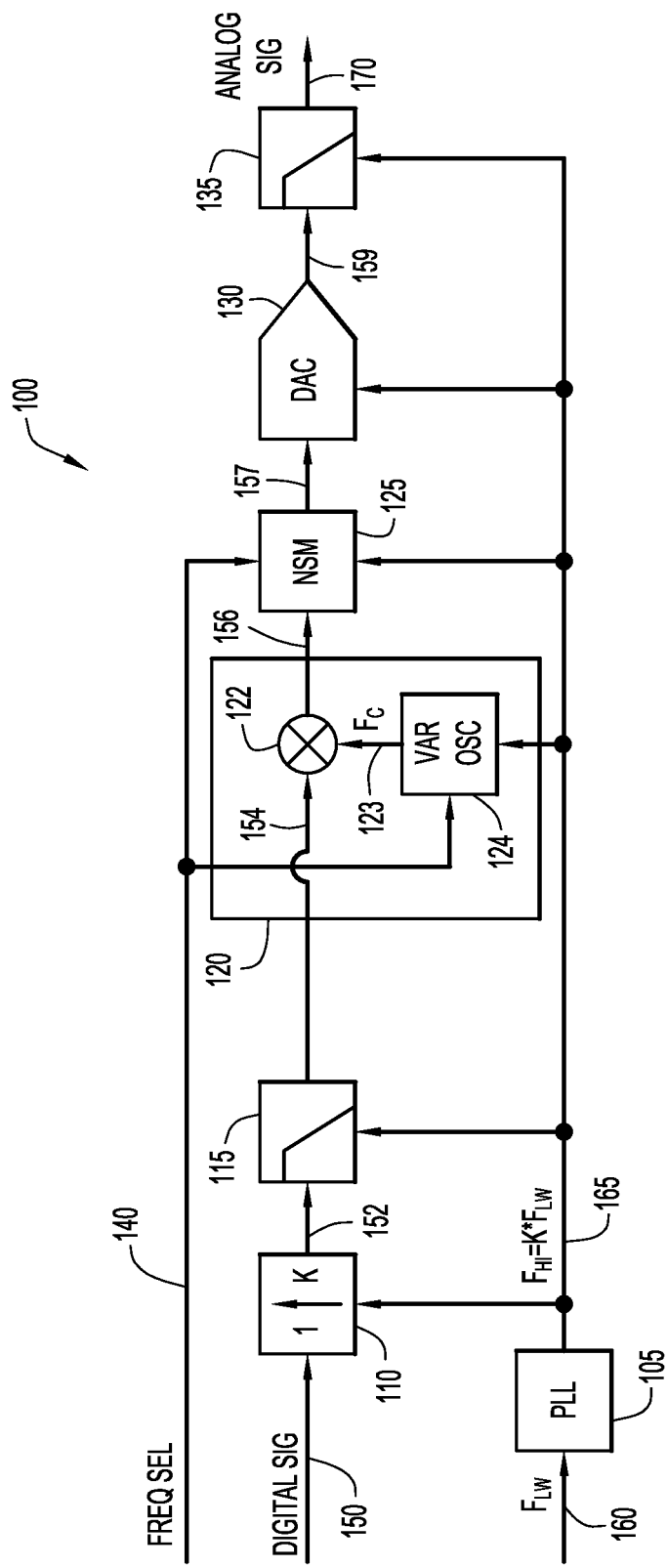
FIG. 1 is a schematic block diagram of a signal modulator implementing arbitrarily variable digital frequency modulation.

The present inventive concept is best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

Additionally, mathematical expressions are contained herein and those principles conveyed thereby are to be taken as being thoroughly described thereby. It is to be understood that where mathematics are used, such is for succinct description of the underlying principles being explained and, unless otherwise expressed, no other purpose is implied or should be inferred. It will be clear from this disclosure overall how the mathematics herein pertain to the present invention and, where embodiment of the principles underlying the mathematical expressions is intended, the ordinarily skilled artisan will recognize numerous techniques to carry out physical manifestations of the principles being mathematically expressed.

FIG. 1 is a schematic block diagram of a signal modulator 100 by which an information-bearing digital signal 150 may be converted into an analog signal 170 conveying that information on an arbitrarily selected carrier signal. It is to be understood that signal modulator 100 is but one example configuration; other system configurations and signals may embody the present invention without departing from the spirit and intended scope thereof.

Digital signal 150 may comprise a sequence of samples of an original upstream analog signal (not illustrated), such as a digital video broadcasting (DVB) signal or a combination of a composite video signal and a corresponding audio signal. The analog output of signal modulator 100, representatively illustrated as analog signal 170, may be a National Television System Committee (NTSC) or Phase Alternating Line (PAL) television signal, tuned by way of a frequency selection signal 140 to a particular analog television channel, such as channel three or channel four (CH3/CH4). Whereas the foregoing example is directed to a television application, the ordinarily skilled artisan will, upon review of this disclosure, recognize other applications in which the present invention may be incorporated without departing from the spirit and intended scope thereof.

Digital signal 150 may be upsampled by upsampler 110 to produce an upsampled digital signal 152, which serves to spread quantization noise introduced in subsequent processing stages. Upsampled signal 152 is subsequently filtered by a digital lowpass anti-aliasing filter 115. The upsampled digital signal 154 is provided to a frequency modulator 120 by which the samples in upsampled digital signal 154 modulate a frequency modulator signal, or vice-versa, to produce a modulated digital signal 156. It is to be understood that the terms, frequency-modulated, frequency modulator and frequency modulation, and similar such terms, refer to the modulation (time-domain multiplication) of the digital signal by samples of, for example, a sinusoid having a selected frequency. The resulting modulated digital signal is not necessarily a frequency modulated signal with respect to the manner in which information is conveyed; the resulting modulated digital signal may be an amplitude modulated signal on a carrier signal at the selected modulation frequency.

Modulated digital signal 156 is provided to a noise shaping modulator (NSM) 125 by which the modulated digital signal 156 is resolution-reduced and by which quantization noise resulting from such resolution reduction is shaped so as to be substantially attenuated in the spectral region of interest. The resulting reduced resolution digital signal 157 is provided to signal converter DAC 130, which generates a coarse analog signal 159 therefrom. The coarse analog signal 157 may then be subsequently smoothed by interpolation filter 135 to produce information-bearing analog signal 170.

Signal modulator 100 operates at a frequency $F_{HI}$ provided by a suitable clock circuit, such as a phase-locked loop (PLL) oscillator 105, that generates a clock signal 165 from an input signal 160 at frequency $F_{LW}$, where $F_{LW} < F_{HI}$. It is to be understood that the word higher is used herein to indicate one clock frequency that is higher than another clock frequency, referred to herein as a lower clock frequency.

The modulator frequency (carrier frequency) $F_C$ is independent of the clock frequency $F_{HI}$ and is selected by frequency selection signal 140. Frequency selection signal 140 is also provided to NSM 125, which uses knowledge of the selected modulator frequency to shape the quantization noise resulting from the resolution reduction. It is to be noted that noise-shaping is performed subsequent to frequency modulation in that the modulator frequency is arbitrarily selectable and, accordingly, the noise characteristics of the modulated signal are variable. Such variability in the noise characteristics may be ameliorated by NSM 125, as described below.

Figure 2:
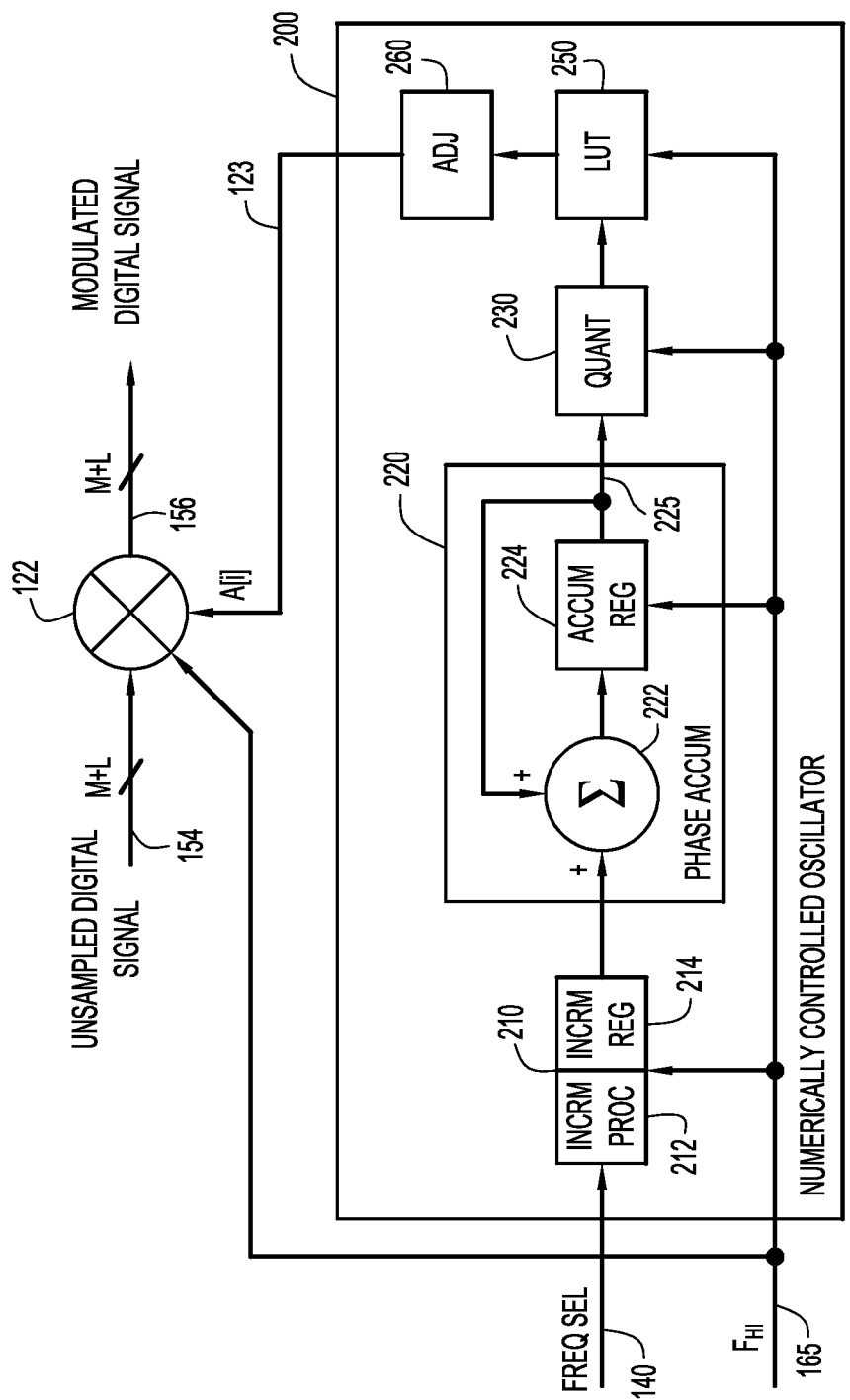
FIG. 2 is a schematic block diagram of a variable oscillator in the form of a numerically-controlled oscillator suitable for implementing arbitrarily variable frequency modulation.

Frequency modulator 120 may include a multiplier 122 and a variable oscillator 124, by which a modulator signal, representatively illustrated at carrier signal 123, having an arbitrarily selectable carrier frequency $F_C$ is generated. Such a variable oscillator 124 shown in FIG. 1 may be implemented by a numerically-controlled oscillator (NCO), such as that illustrated in FIG. 2 as NCO 200. As illustrated in FIG. 2, frequency selection signal 140 is provided to a phase increment unit 210, which may comprise an increment processor 212 and a phase increment register 214. Increment processor 212 may determine an incremental phase value from the indication of the desired carrier frequency $F_C$ carried on frequency selection signal 140. The computed incremental phase value is stored in incremental phase register 214 and access thereto is provided to phase accumulator 220, at which the phase value is accumulated over consecutive cycles of clock signal 165. That is, at every clock cycle of clock signal 165, the incremental phase value stored in register 214 is added, by way of adder 222, to the phase value stored in accumulation register 224. The remainder of accumulated phase values in accumulation register 224 caused by register overflow is retained therein as a phase offset in the subsequent accumulation cycle.

An accumulated phase value 225 is provided to phase-to-amplitude quantizer 230 which generates an address into lookup table (LUT) 250. LUT 250 has stored therein amplitude values of a modulation waveform, such as a sinusoidal wave, corresponding to the phase indicated in each accumulated phase value 225 provided to quantizer 230. The amplitude value is provided to an adjustment processor 260 to refine the values retrieved from LUT 250 so as to minimize undesirable artifacts in the modulation carrier signal 123. In certain embodiments, LUT 250 may contain a small number of entries that coarsely define the ultimate waveform. When so embodied, adjustment processor 260 may interpolate the LUT entries to generate higher resolution values. Adjustment processor 260 may make other adjustments, such as, for example, phase adjustments and smoothing, depending on the application for which the signal modulator 100 is implemented. The adjusted amplitude value is output and, over successive cycles of clock 165, multiplicative values A[i] of carrier signal 123 are provided to multiplier 122. Thus, regardless of the clock frequency $F_{HI}$, the carrier frequency $F_C$ can be arbitrarily selected in accordance with frequency selection signal 140.

NSM 125 performs two primary functions: resolution reduction and noise-shaping. Resolution reduction allows signal converter DAC 130 to operate at a higher speed than that required for full resolution conversion. Such resolution reduction, however, introduces quantization noise into the reduced resolution signal 157. Compounding such quantization error is the application of the clock-frequency independent multiplication factors A[i] applied to filtered up-sampled signal 154 by multiplier 122. The noise-shaping function of NSM 125 ameliorates the quantization noise through noise-shaping techniques, such as those described in the paragraphs that follow.

Figure 3A:
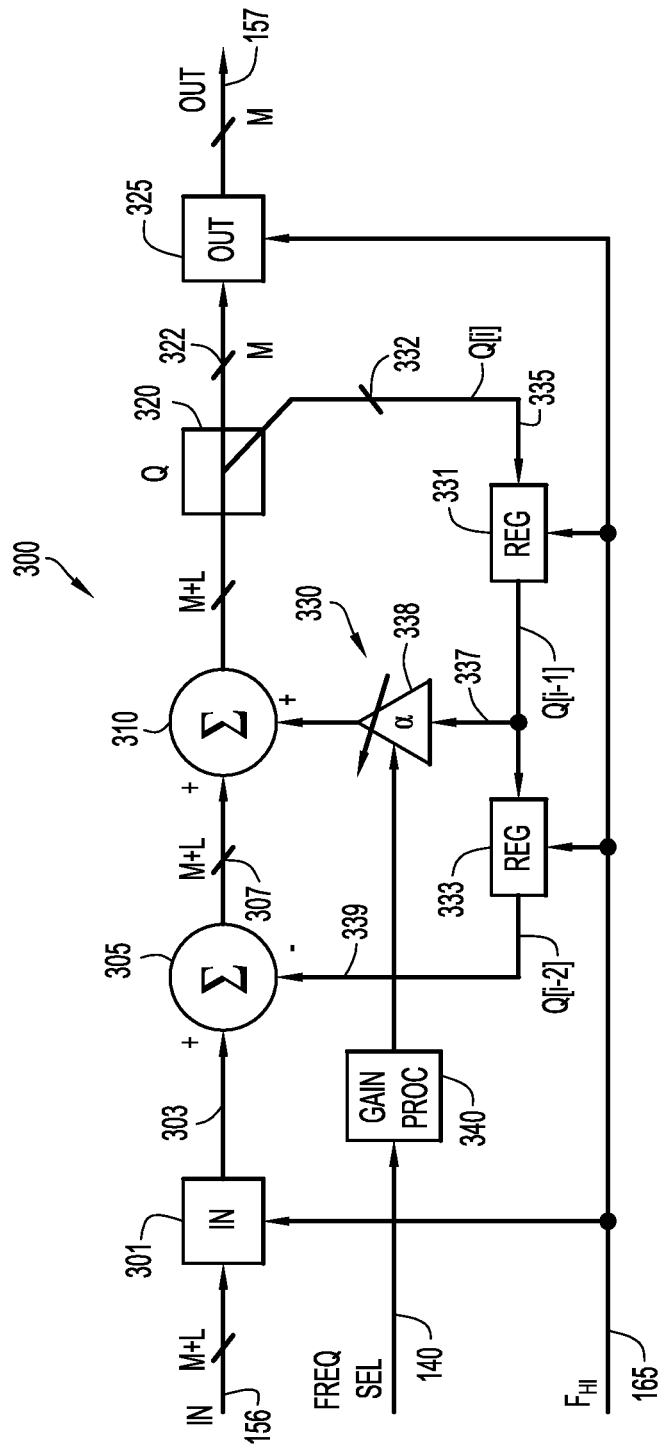
FIG. 3A is a schematic block diagram of a digital-to-digital sigma-delta modulator for implementing variable noise-shaping modulation.
Figure 3B:
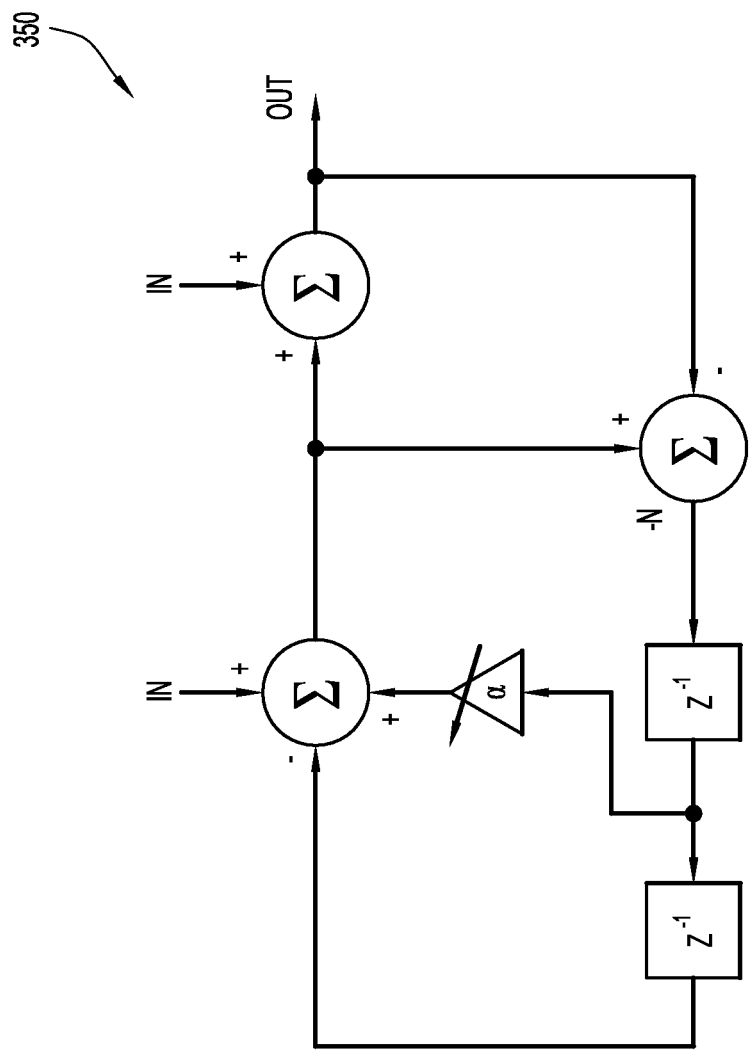
FIG. 3B is a frequency domain (z-domain) representation of the digital-to-digital sigma-delta modulator illustrated in FIG. 3A.

FIG. 3A illustrates a sigma-delta modulator (SDM) 300 that may be used as NSM 125 in FIG. 1. FIG. 3B is a frequency (z-domain) representation of SDM 300. It is to be understood that FIGS. 3A-3B are conceptual diagrams representing a second-order digital-to-digital SDM implementing a programmable, or variably selectable noise transfer function. Numerous circuits may be constructed to practice the concepts described with reference to FIGS. 3A-3B as will be recognized by the ordinarily skilled artisan.

As illustrated in FIG. 3A, each sample in modulated signal 156 may be a digital word of width M+L bits representing a value of the modulated, information-bearing signal. The present invention is not limited to a specific word width or to the division of M and L within a word. For purposes of description and not limitation, M will refer to a number of most-significant bits (MSB) of the digital sample word and L will refer to the remaining least-significant bits (LSB) of the sample word. For example, a sample value may occupy ten (10) bits, where M=5, the five most-significant bits and L=5, the five least-significant bits. The M+L bits of the digital word may be conveyed in respective conductors of an M+L wide bus, representatively illustrated at bus 307.

Modulated signal 156 is provided to input port 301, through which the samples are accepted into SDM 300 at clock frequency $F_{HI}$. Resolution-reduced samples exit SDM 300, or are otherwise provided to DAC 130 through an output port 325 also at the clock frequency $F_{HI}$. Resolution reduction may be achieved by a quantizer 320, by which the M most-significant bits of the digital words being quantized are provided to output port 325 and the remaining L least-significant bits are fed back along a feedback path 335. Quantizer 320 may be implemented by a suitable bus configuration where the M most-significant bits, referred to herein as an output word, are conveyed over an M-bit wide bus, representatively illustrated at bus 322, and the L least significant bits, referred to herein as a quantization error word, are conveyed over an L-bit wide bus, representatively illustrated at bus 332. It is to be understood that other quantizer configurations may be used in conjunction with the present invention without departing from the spirit and the intended scope thereof.

Feedback path 335 conveys quantization error words, denoted hereinafter as Q[i], through a feedback circuit 330 to respective adders 310, 305 in the forward path at the clock frequency $F_{HI}$. After a unit sample storage interval in register 331, Q[i−1] is conveyed to circuit branch 337 and to register 333. After another unit sample storage interval in register 333, Q[i−2] is conveyed along circuit branch 339 to adder 305. Feedback circuit 330 includes a variable-gain multiplier 338 in circuit branch 337 the output of which, α·Q[i−1], is provided to adder 310. Feedback circuit 300 processes and distributes the words Q[i] and α·Q[i−1] along a processing trajectory by which noise shaping is realized. The ordinarily skilled artisan will recall that noise-shaping in an SDM pushes quantization noise into frequency bands outside and significantly removed from the baseband spectrum. In addition to such noise shaping, the gain a of variable-gain multiplier 330 may be computed by gain processor 340 such that a spectral null is located in the spectrum of modulated digital signal 157 at the carrier frequency $F_c$.

A frequency domain representation 350 of second-order sigma-delta modulator (SDM) 300 is illustrated in FIG. 3B. Since reducing the resolution of a digital signal by conveying only the most-significant M bits thereof to the DAC manifests itself as a deviation from the desired output signal, the quantization realized by quantizer 320 is modeled as additive quantization noise N, representatively illustrated at adder 355.

From frequency representation 350, the ordinarily skilled artisan will recognize that the Noise Transfer Function (NTF) of SDM 300 is given by:

$$NTF = \frac{OUT(z)}{N(z)}\bigg|_{IN(z)=0} = 1 - \alpha z^{-1} + z^{-2} = \frac{z^2 - \alpha z + 1}{z^2}. \quad (1)$$

Complex conjugate zeros of this NTF occur at a normalized frequency $f_0$ by the relationship:

$$\alpha = 2\cos(2\pi f_0), \quad (2)$$

where $f_0$ is the selected frequency normalized to the sampling frequency, i.e., $F_C/F_{HI}$.

Accordingly, Equation 2 may be rewritten as:

$$\alpha = 2\cos\left(2\pi \frac{F_C}{F_{HI}}\right). \quad (3)$$

Gain processor 340 may thus compute the gain a for a given carrier frequency $F_C$ from a relationship such as that exemplified by Equation 3. Such computation may be carried out in a variety of ways, such as, for example, by fixed logic or other circuitry, or by processing instructions executing on a programmable processor.

Figure 4:
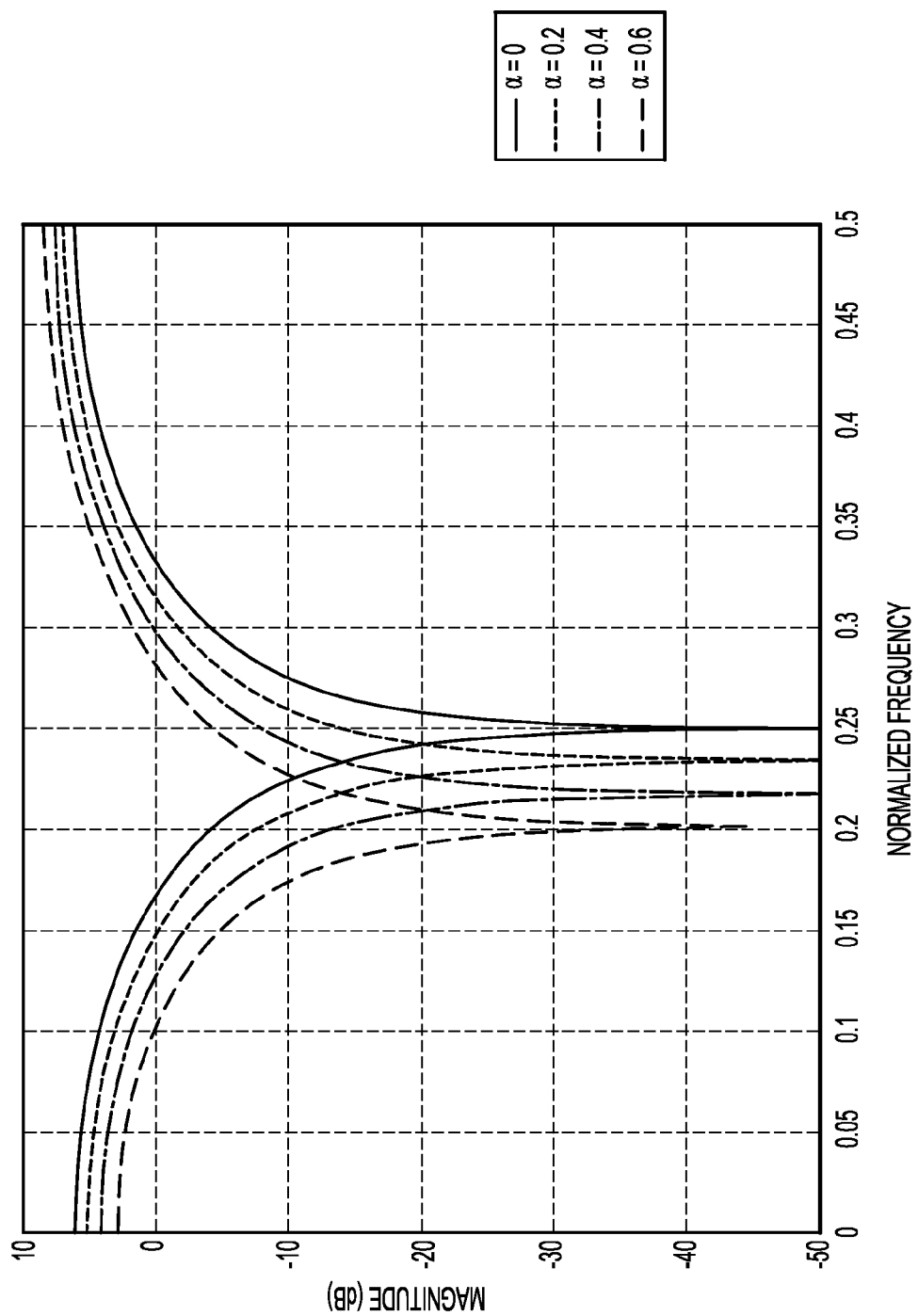
FIG. 4 is a graph depicting the location of a spectral null in the noise transfer function of the circuit depicted in FIGS. 3A-3B for different values of a noise-shaping gain factor.

Spectra of the NTF of Equation 1 for various values of α are illustrated in FIG. 4. As illustrated in the figure, the spectral null of the NTF is programmable, i.e., is located in accordance with a given carrier frequency $F_C$.

Figure 5:
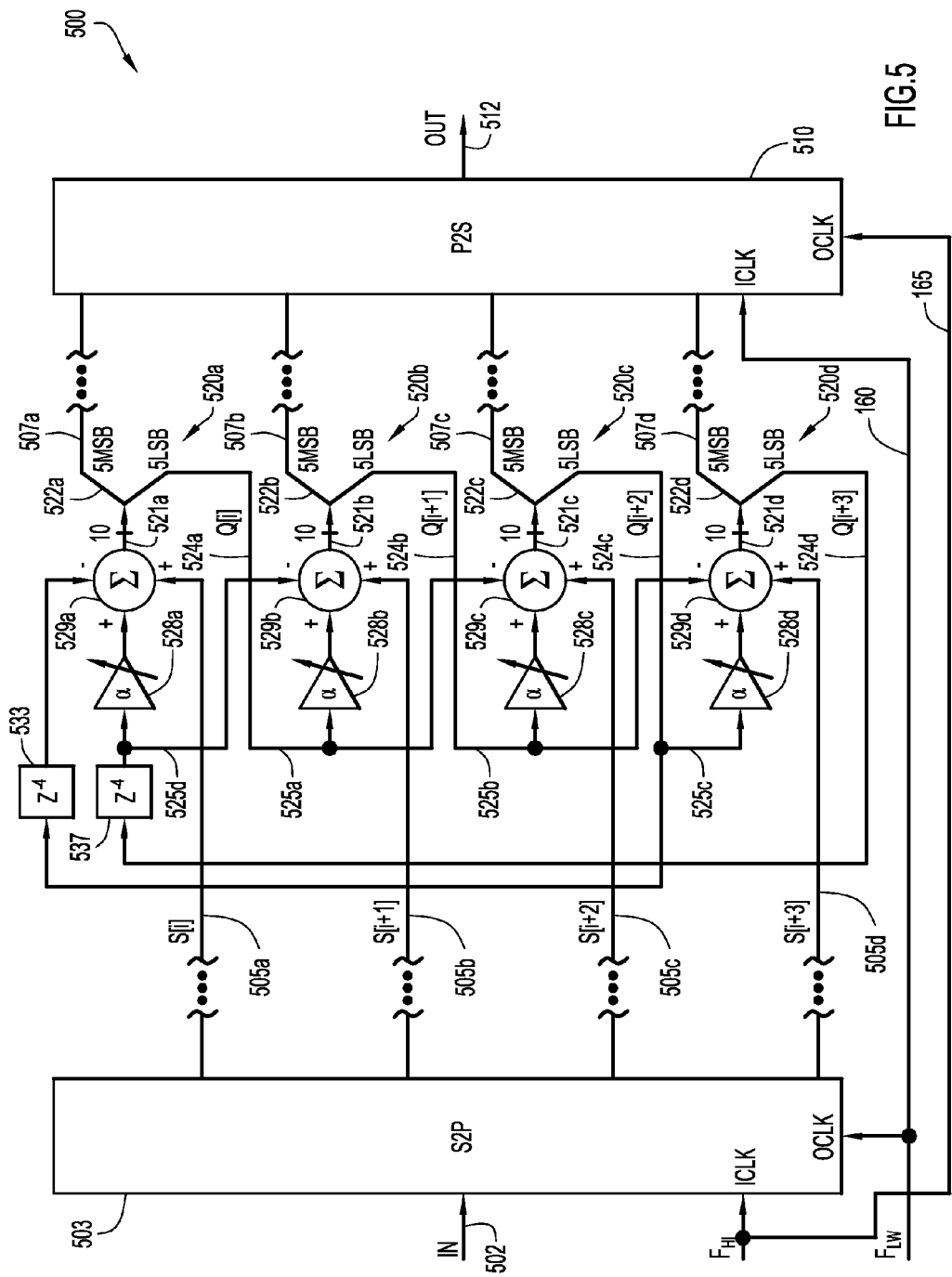
FIG. 5 is a schematic block diagram of a parallel digital-to-digital sigma-delta modulator implementing variable noise-shaping.

FIG. 5 illustrates another example of a sigma-delta modulator configuration that may implement NSM 125 in FIG. 1. SDM 500 of FIG. 5 is embodied as a 4X parallel second-order SDM comprising four (4) parallel second-order SDM stages 520a-520d, representatively referred to herein as stage(s) 520. Stages 520 may comprise respective variable gain multipliers 528a-528d, representatively referred to as variable gain multiplier(s) 528, and respective adders 529a-529d, representatively referred to herein as adder(s) 529. The output of adders 529 are conveyed over respective full-resolution output buses 521a-521d, representatively referred to as full-resolution output bus(es) 521. Reduced-resolution samples are provided at respective output ports 507a-507d, representatively referred to herein as output port(s) 507. The samples processed by SDM 500 are conveyed over a ten (10) bit wide bus, with the exception that the output buses 522a-522d, representatively referred to herein as output bus(es) 522, of output ports 507 comprise a five (5) bit bus conveying the five (5) most significant bits of the full-resolution word on full-resolution output buses 521. The five (5) least-significant bits of the full-resolution word on full-resolution output buses 521 are carried on respective feedback buses 524a-524d, representatively referred to herein as feedback bus(es) 524.

As illustrated in FIG. 5, input samples to SDM 500 are provided thereto in parallel, such as by way of a serial-to-parallel converter (S2P) 503. For example, in the case of the 4X parallel SDM 500, four (4) consecutive samples of a digital data stream 502 are provided to respective input ports 505a-505d, representatively referred to herein as input port(s) 505. S2P 503 may implement circuitry (not illustrated) by which consecutive samples are accepted at a clock rate of an input clock signal ICLK and such samples are provided in parallel at a clock rate of an output clock signal OCLK. It is to be understood that while two clock inputs are illustrated for S2P 503, such is solely for purposes of explanation. Either clock signal ICLK or OCLK may be derived internally from the other, thereby necessitating only a single clock input to S2P 503. In complementary fashion, output ports 507 of SDM 500 may communicatively coupled to a parallel-to-serial converter (P2S) 510 to provide consecutive output words in a resolution-reduced output stream 512. P2S 510 may implement circuitry (not illustrated) by which parallel samples are accepted at a clock rate of an input clock signal ICLK and such samples are provided in a serial stream at a clock rate of an output clock signal OCLK. As illustrated in FIG. 5, input signal 502 may be serially input to S2P 502 and output signal 512 may be serially output from P2S 510 at a clock rate of $F_{HI}$. Full resolution input samples are provided in parallel to SDM 500 from S2P 503 at a clock rate of $F_{LW}$. Reduced resolution output samples are provided in parallel to P2S 510 at the same clock rate $F_{LW}$. Accordingly, resolution reduction and noise-shaping operations of SDM 500 may be performed in parallel using lower speed components, e.g., components that can complete processing of all parallel samples within a period on the order of $F_{LW}^{-1}$, while the output serial stream 512 is converted at the higher clock rate $F_{HI}$.

SDM 500 includes feedback circuits 525*a*-525*d*, representatively referred to herein as feedback circuits 525, by which the quantization word of each stage 520 is processed and distributed among other stages 520 so that second-order sigma-delta modulation is achieved in a manner similar to that described with reference to FIGS. 3A-3B. As illustrated in FIG. 5, the quantization word Q[i] on feedback bus 524*a*, which originates from input sample S[i], is multiplied by variable gain multiplier 528*b* and added to input sample S[i+1]. Additionally, quantization word Q[i] is added to input sample S[i+2]. The ordinarily skilled artisan will recognize that these same operations occur in the second-order SDM 300 illustrated in FIG. 3A. However, samples S[i] through S[i+3] are all processed by SDM 500 substantially simultaneously, i.e., within a sample period $F_{LW}^{-1}$, as opposed to sequentially in SDM 300. The four (4) sample delays represented by delay blocks 533, 534 correspond to the time required to clock input samples into S2P 503 and to clock output samples from P2S 510.

Figure 6:
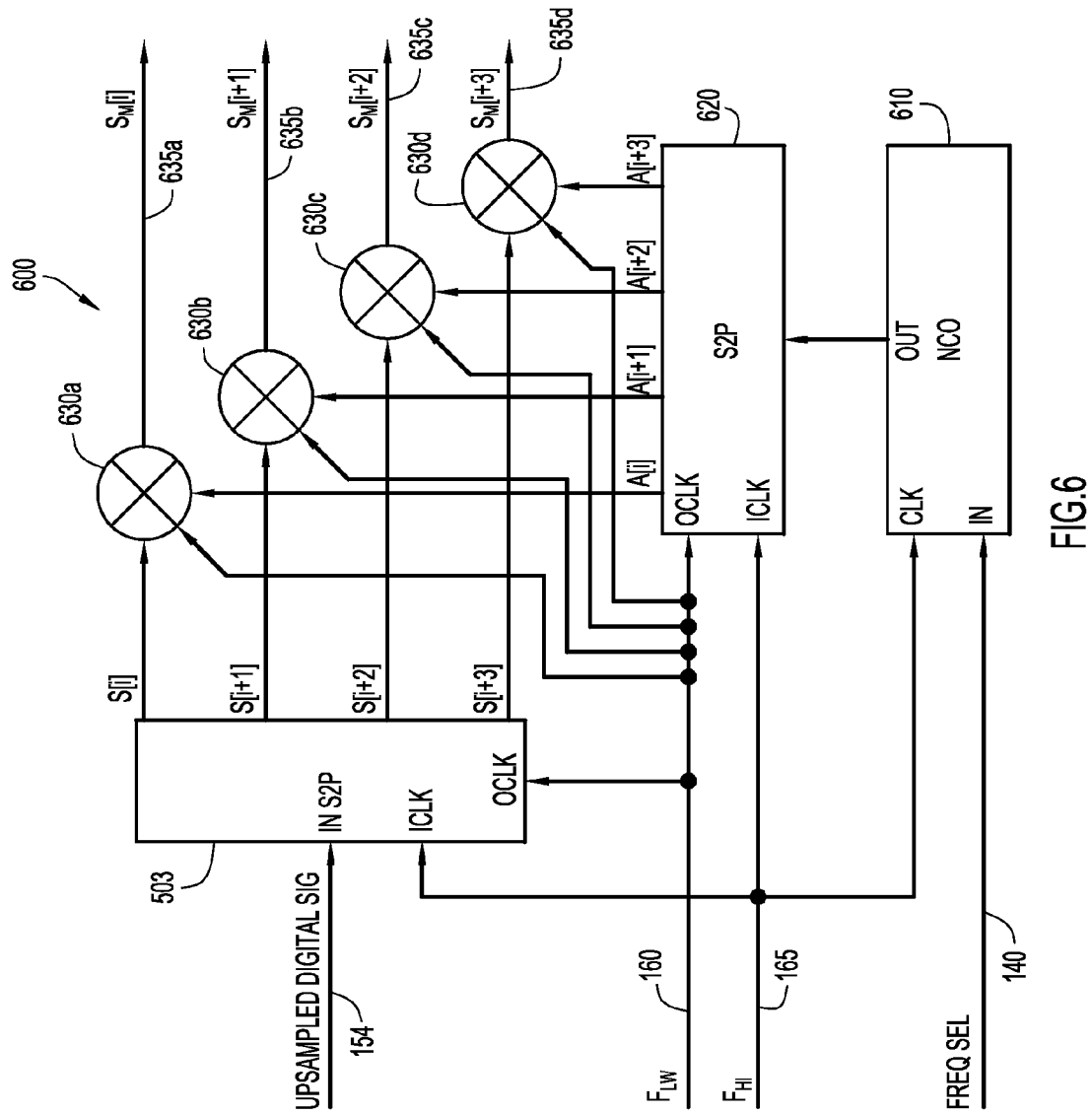
FIG. 6 is a schematic block diagram of a parallel arbitrarily selectable frequency modulator.

It is to be understood that while SDM 500 is illustrated and described as implemented by four (4) parallel second-order stages, the present invention is limited neither to the number of parallel stages 520 nor to the degree of feedback in each stage. Additionally, while in certain embodiments, S2P 503 may be directly connected to input ports 505 and P2S 510 may be directly connected to output ports 507, in other embodiments, S2P 503 may be located further upstream in the signal modulator circuit 100 than at the input of SDM 500. In such case, suitable parallel processing components may be substituted for the serial processing components illustrated in FIG. 1. For example, the input of S2P 503 may be directly connected to the output of filter 115, in which case frequency modulator 120 may be implemented in a parallel processing configuration, such as is illustrated by parallel modulator 600 in FIG. 6. As illustrated in FIG. 6, upsampled signal 154 from filter 115 is provided to S2P 503, which parallelizes samples S[i] through S[i+3] as discussed above with reference to FIG. 5. NCO 610 produces modulation samples, such as by processes described with reference to FIG. 2, which are provided to S2P 620. S2P 620 may be of similar construction as that of S2P 503, where serial input samples are clocked in at frequency $F_{HI}$ and clocked out at frequency $F_{LW}$. The outputs of S2P 520, S[i] through S[i+3], are multiplied by modulation samples A[i] through A[i+3] output by S2P 620, respectively, by multipliers 630*a*-630*d*. Modulated output samples, $S_M$[i] through $S_M$[i+3] are output at output ports 635*a*-635*d*.

While only a parallel frequency modulator 600 has been illustrated and described, it is to be understood that similar parallel components may be utilized as appropriate to the placement of S2P 503 in the signal processor 100. Such parallel processing allows sample processing at a lower rate than that of the DAC conversion rate, thereby simplifying the circuitry and reducing the power consumption In FIG. 7, a signal modulation process 700 is illustrated through which the present invention may be embodied. The operations of process 700 may be achieved through suitable hardware and/or software, such as by the mechanisms described above. In operation 705, an arbitrary modulation frequency is selected. A carrier signal, for example, having the modulation frequency can carry information provided by a digital signal, samples of which are received in operation 720. The input samples are upsampled and filtered corresponding to a higher clock rate, $F_{HI}$.

From the arbitrary modulation frequency selected in operation 705, a phase increment is computed in operation 710, which, in turn, is used to generate modulation samples of the carrier signal in operation 715. The upsampled input samples are multiplied by respective modulation samples in operation 730. The modulated samples are then resolution-reduced and noise-shaped at the lower clock frequency $F_{LW}$ in operations 735, 740 and 750. The upper bits of the modulated digital signal are output, once noise-shaped by operations 735 and 740, as resolution-reduced samples of an output signal, which is converted into a modulated analog signal at the higher clock frequency in operation 755. The lower bits of the modulated signal are gain-multiplied at the lower clock frequency in operation 735. The gain α that is applied in operation 735 is computed in operation 745 from the modulation frequency selected in operation 705. The gain-multiplied samples and samples free from such gain are temporally distributed in a feedback process in operation 740 such that a spectral null in the NTF of the modulated signal is located at the modulation frequency.

Certain embodiments of the present invention provide for the functional components to manufactured, transported, marketed and/or sold as processor instructions encoded on non-transitory computer-readable media. For example, one such computer-readable medium (not illustrated) may be provided to a circuit fabrication process 800 carrying processor instructions 803 that, when executed by an Electronic Design Automation (EDA) interface processor 805, a graphical representation of an embodiment of the present invention is presented to a user, such as on a display device (not illustrated). Through EDA interface 805, a circuit designer may incorporate the present invention into a larger circuit design. Once a circuit design has been completed, another non-transitory computer-readable medium (not illustrated) carrying other processor instructions 810, such as a hardware description language, may be provided to a design data realization processor 815. The design data realization processor 815 may convert the instructions 810 provided thereto into another set of processor instructions 820, by which a tangible e.g., integrated circuit 830, may be realized when executed by a circuit fabrication system 825. Such realization data 135 may include data to construct component and interconnect mask patterns, component placement location data, packaging data, and any other data necessary in a fabrication process to produce the finished circuit product 830. Other realization data 820 may include milling machine instructions and wiring instruction data, where the specific form of the realization data 820 is dependent on the type of circuit 830 in which the present invention is embodied.

Processor instructions 803, 810 and 820 may be encoded on non-transitory computer-readable media. The present general inventive concept, when so embodied, can be practiced regardless of the processing platform on which the processor instructions are executed and regardless of the manner by which the processor instructions are encoded on the computer-readable medium.

Figure 7:
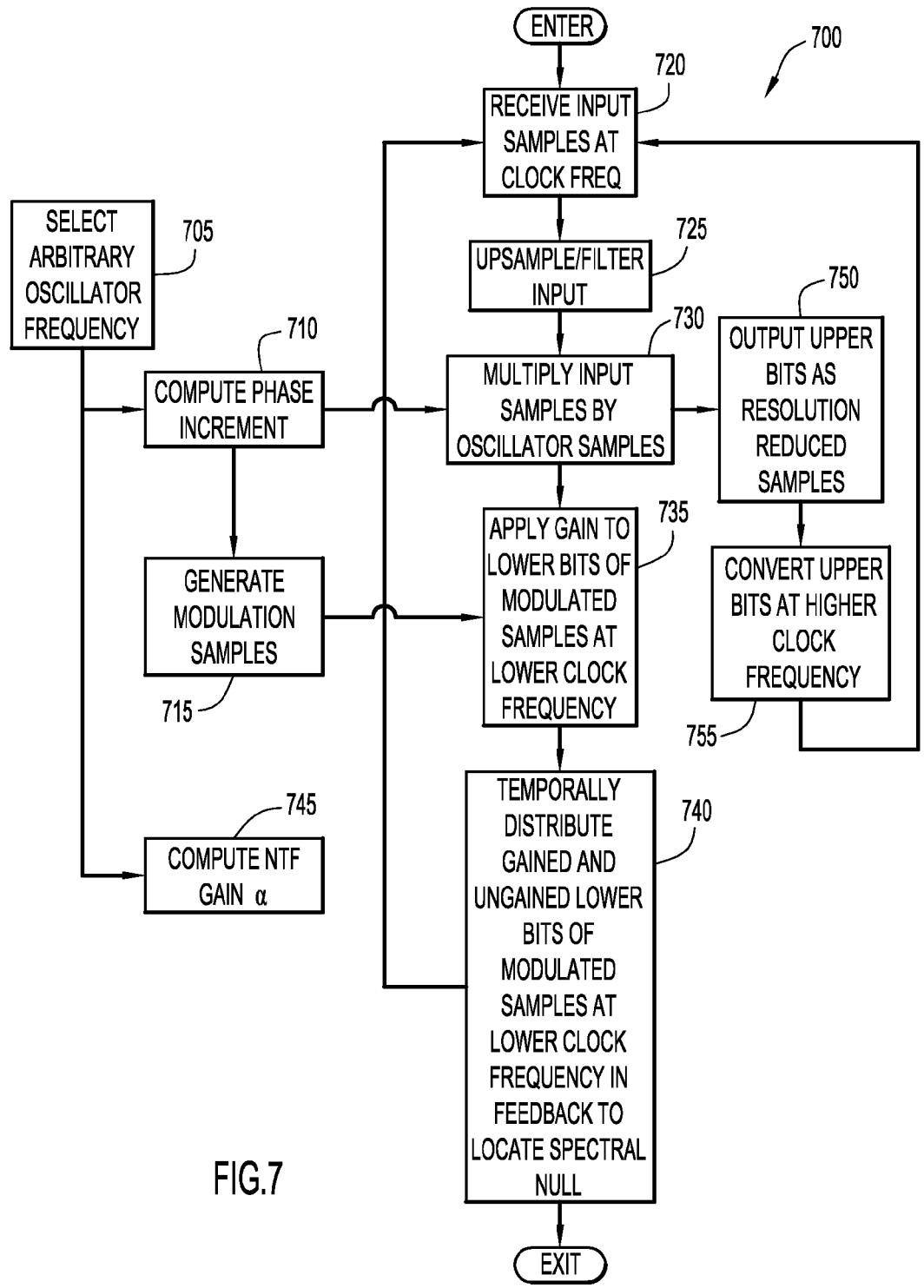
FIG. 7 is a flow diagram of a signal modulation process implementing arbitrarily variable digital frequency modulation.
Figure 8:
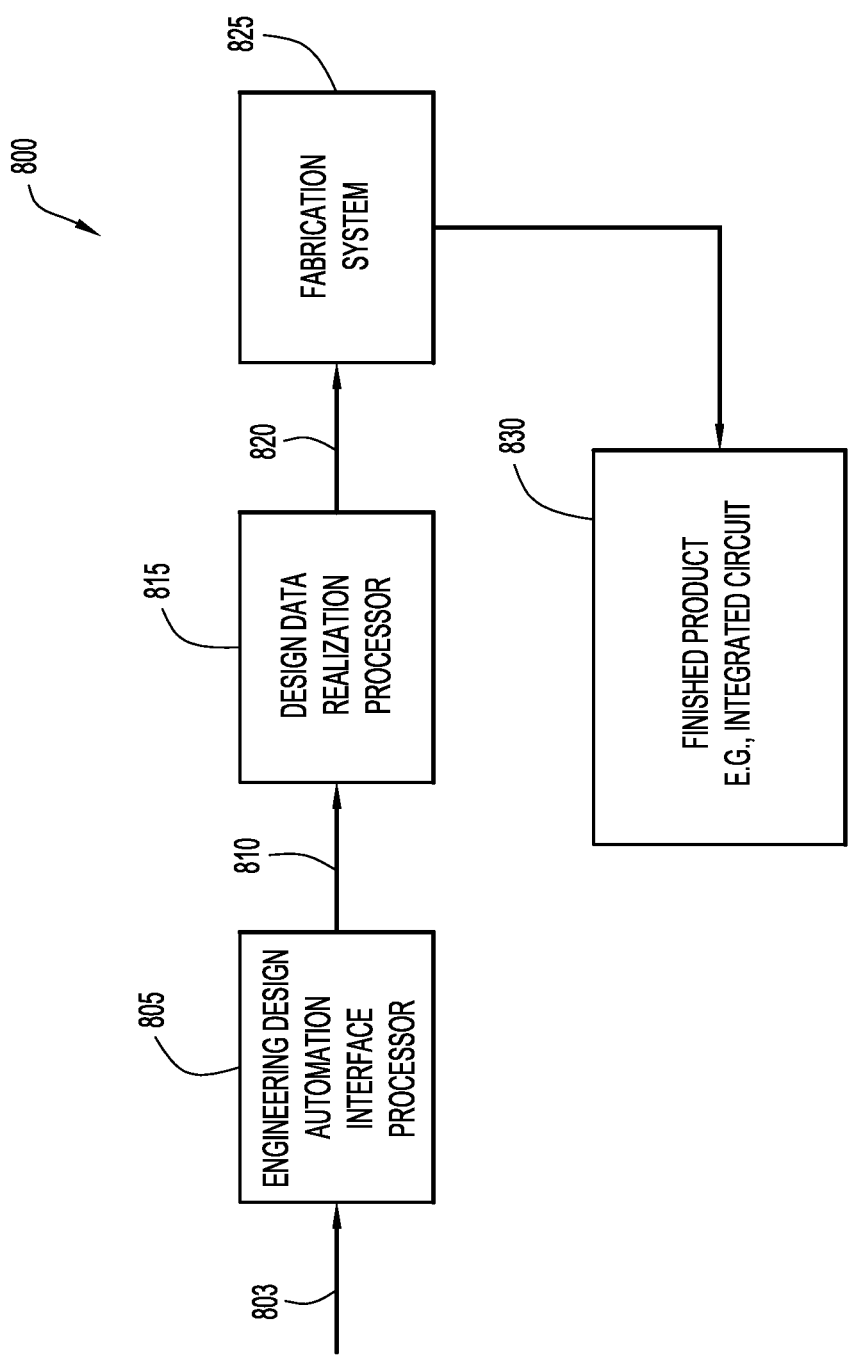
FIG. 8 is a block diagram of a circuit design and fabrication process by which an arbitrarily variable digital frequency modulator circuit may be fabricated.

It is to be understood that the computer-readable medium described above may be any non-transitory medium on which the instructions 803, 810 and 820, as well as processor instructions that implement process 700 in FIG. 7, may be encoded and then subsequently retrieved, decoded and executed by a processor, where such media includes electrical, magnetic and optical storage devices. Examples of non-transitory computer-readable media include, but not limited to, read-only memory (ROM), random-access memory (RAM), and other electrical storage; CD-ROM, DVD, and other optical storage; and magnetic tape, floppy disks, hard disks and other magnetic storage. The processor instructions may be derived from algorithmic constructions in various programming languages that realize the present invention as exemplified by the embodiments described above.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

What is claimed is:

1. An apparatus comprising:
   a frequency modulator to generate a modulated digital signal from an information-bearing digital signal and a modulation signal having an arbitrary modulation frequency established in accordance with a frequency selection signal;
   a noise-shaping modulator to generate a reduced resolution digital signal from the modulated digital signal such that quantization noise is attenuated by a spectral null of a noise transfer function characterizing the noise-shaping modulator; and
   a signal converter to generate an analog signal conveying the information of the information-bearing digital signal on an analog carrier signal having the modulation frequency.

2. The apparatus of claim 1, wherein the noise-shaping modulator and the signal converter are clocked at respective clock frequencies that are independent of the modulation frequency.

3. The apparatus of claim 2 further comprising:
   an oscillator communicatively coupled to the signal converter to provide thereto a clock signal at a clock frequency, the clock signal being derived from another oscillator that generates another clock signal at a lesser clock frequency that is less than the clock frequency provided to the signal converter.

4. The apparatus of claim 3, wherein the frequency modulator comprises a multiplier to multiply samples in the information-bearing digital signal by samples of the modulation signal.

5. The apparatus of claim 4, wherein the noise-shaping modulator comprises:
   a quantizer to generate a reduced resolution digital word for each word of the modulated digital signal to provide to the signal converter in the reduced resolution digital signal, the quantizer generating a quantization error word for each word of the modulated digital signal;
   a variable multiplier to multiply the quantization error word by a value selected in accordance with the modulation frequency such that the quantization noise generated by the resolution reduction of the quantizer is attenuated by the spectral null of the noise transfer function characterizing the noise-shaping modulator; and
   an adder to add the multiplied quantization error word to a subsequent word of the modulated digital signal.

6. The apparatus of claim 5, wherein the quantizer comprises:
   a multi-conductor bus of conductors by which a number of upper bits of the word of the modulated digital signal are directed in a circuit path out of the noise-shaping modulator as the reduced resolution digital word and a number of lower bits of the word of the modulated digital signal are directed to the variable multiplier of the noise-shaping modulator as the quantization error word.

7. The apparatus of claim 6, wherein the noise-shaping modulator operates at the lesser clock frequency.

8. The apparatus of claim 7 further comprising:
   a serial-to-parallel converter to provide the words of the information-bearing digital signal to the noise-shaping modulator in separate channels thereof to be processed in parallel thereby at the lesser clock frequency; and
   a parallel-to-serial converter to provide the reduced resolution digital words of the reduced-resolution digital signal in a serial stream at the clock frequency to the signal converter.

9. The apparatus of claim 8, wherein the noise-shaping modulator comprises:
   a plurality of noise-shaping modulator stages, each comprising the noise-shaping modulator and generating respective reduced resolution digital words of the reduced-resolution digital signal, the noise-shaping modulator stages providing the reduced resolution digital words of the reduced resolution digital signal in parallel to the parallel-to-serial converter.

10. The apparatus of claim 4, wherein the frequency modulator comprises a numerically controlled oscillator.

11. A method comprising:
    receiving words of an information-bearing digital signal;
    generating modulation words of a modulation signal corresponding to a modulation frequency;
    multiplying the words of the digital signal with the modulation words at a clock frequency to generate a modulated digital signal;
    reducing the resolution of the modulated digital signal; and
    generating an analog signal having the modulation frequency so as to convey the information therein, the analog signal being converted from the reduced-resolution digital signal at the clock frequency that is independent of the modulation frequency.

12. The method of claim 11, wherein reducing the resolution comprises:
    quantizing words of the modulated digital signal to generate reduced resolution-digital words and corresponding quantization error words therefrom;
    multiplying the quantization error words by a value selected in accordance with the modulation frequency such that quantization noise is attenuated at a spectral null in a frequency spectrum of a noise transfer function characterizing the resolution reduction; and
    adding the multiplied quantization error word to subsequent words of the modulated digital signal.

13. The method of claim 11, further comprising:
    providing, by serial-to-parallel conversion, the words of the information-bearing digital signal in separate channels to be processed in parallel at a lesser clock frequency that is less than the clock frequency;
    quantizing, at the lesser clock frequency, the parallel words of the modulated digital signal to generate, for each of the separate channels, reduced resolution-digital words and corresponding quantization error words;
    multiplying, at the lesser clock frequency, the quantization error words in each channel by a value selected in accordance with the modulation frequency such that quantization noise is attenuated at a spectral null in a frequency spectrum of a noise transfer function characterizing the resolution reduction;

adding, at the lesser clock frequency, the multiplied quantization error word to words of the modulated digital signal in at least one other separate channel;

providing, by parallel-to-serial conversion, the parallel reduced resolution digital words in a serial stream at the clock frequency; and generating the analog signal from the serial stream.

14. A tangible non-transient computer-readable medium encoded with instructions which, when executed by a processor, cause:

a frequency modulator to generate a modulated digital signal from an information-bearing digital signal and a modulation signal having an arbitrary modulation frequency established in accordance with a frequency selection signal;

a noise-shaping modulator to generate a reduced resolution digital signal from the modulated digital signal such that quantization noise is attenuated by a spectral null of a noise transfer function characterizing the noise-shaping modulator; and a signal converter to generate an analog signal conveying the information of the information-bearing digital signal on an analog carrier signal having the modulation frequency.

15. The tangible non-transient computer-readable medium of claim 14, wherein the instructions are configured to cause:

an oscillator communicatively coupled to the signal converter to provide thereto a clock signal at a clock frequency, the clock signal being derived from another oscillator that generates another clock signal at a lesser clock frequency that is less than the clock frequency provided to the signal converter.

16. The tangible non-transient computer-readable medium of claim 15, wherein the instructions are configured to cause:

a multiplier in the frequency modulator to-multiply words in the digital signal by samples of the modulation signal.

17. The tangible non-transient computer-readable medium of claim 16, wherein the instructions are configured to cause:

a quantizer in the noise-shaping modulator to generate a reduced resolution digital word for each word of the modulated digital signal to provide to the signal converter in the reduced resolution digital signal, the quantizer generating a quantization error word for each word of the modulated digital signal;

a variable multiplier in the noise-shaping modulator to multiply the quantization error word by a value selected in accordance with the modulation frequency such that the quantization noise generated by the resolution reduction of the quantizer is attenuated by the spectral null of the noise transfer function characterizing the noise-shaping modulator; and an adder in the noise-shaping modulator to add the multiplied quantization error word to a subsequent word of the modulated digital signal.

\* \* \* \* \*